United States Patent [19]

Bube

[11] 4,273,822
[45] Jun. 16, 1981

[54] GLAZING PASTE FOR BONDING A METAL LAYER TO A CERAMIC SUBSTRATE

[75] Inventor: Kenneth R. Bube, Skillman, N.J.

[73] Assignee: RCA Corporation, New York, N.Y.

[21] Appl. No.: 816,712

[22] Filed: Jul. 18, 1977

[51] Int. Cl.$^3$ .................. B32B 5/16; B32B 15/04; B32B 17/06
[52] U.S. Cl. .................................. 428/216; 106/53; 428/212; 428/213; 428/215; 428/328; 428/336; 428/426; 428/427; 428/428; 428/434; 428/438; 428/901; 428/432
[58] Field of Search ............... 428/434, 427, 428, 426, 428/901, 215, 216, 213, 328, 336, 438, 432; 106/53; 252/512, 518, 514, 521

[56] References Cited

U.S. PATENT DOCUMENTS

| | | | |
|---|---|---|---|
| 3,060,610 | 10/1962 | Stangl | 428/434 |
| 3,434,877 | 3/1969 | Degenkolb | 428/434 |
| 3,537,892 | 11/1970 | Milkovich | 428/434 |
| 3,746,568 | 7/1973 | Rybarczyk | 428/434 |
| 3,770,496 | 11/1973 | Short | 428/434 |
| 3,846,222 | 11/1974 | Dietz | 428/434 |
| 3,944,696 | 3/1976 | Larry | 428/434 |
| 4,050,956 | 9/1977 | Bruin | 428/434 |

*Primary Examiner*—Ellis P. Robinson
*Attorney, Agent, or Firm*—H. Christoffersen; Birgit E. Morris; Allen Bloom

[57] ABSTRACT

A glazing paste comprising glass frit, a metal oxide powder selected from the group consisting of aluminum oxide ($Al_2O_3$), magnesium oxide (MgO), calcium oxide (CaO), and zinc oxide, (ZnO), and an organic vehicle.

17 Claims, No Drawings

4,273,822

GLAZING PASTE FOR BONDING A METAL LAYER TO A CERAMIC SUBSTRATE

The invention herein described was made in the course of or under a contract with the U.S. Government.

BACKGROUND OF THE INVENTION

In constructing hybrid microcircuits, metal layers are formed on ceramic substrates from metal powders which are bonded to the substrate by utilizing glazing paste. The metal powders can be mixtures of the noble metals such as gold, silver, platinum and palladium and the glazing paste is glass frit suspended in an organic vehicle. The metal powder combined with the glazing paste are applied to the substrate and heated to about 900° C. to remove the organic vehicle, to melt the glass frit which fuses the metal to the substrate and to alloy the metal powder constituents.

In this process, however, the glass frit causes a glass surface to form on the formed metal surface which is referred to as overglazing. The overglazing presents a problem when soldering onto the metal surface is required, since solder does not adhere well to the overglaze. The surface overglaze can be removed by abrasion or burnishing, but this is an expensive, labor consuming process, and often weakens the bond between the metal and the ceramic substrate. Additionally, damage may result to adjacent circuit components.

In U.S. Pat. No. 3,903,344 to Laiming, a solution to this problem is described. A two layer glazing approach is employed wherein a first, lower layer rich in glass frit is fired onto the ceramic substrate and then a second, upper layer, having a low glass frit content but a high metal content, is fired onto the lower, glass-rich layer. When the first glass-rich layer is sufficiently thin and the second metal rich layer is sufficiently thick, no overglazing occurs and solder will adhere well to the metal layer.

It has been desired, however, to use a comparatively thicker, glass-rich first layer with a thinner, metal-rich second layer and still avoid overglazing. A thicker, glass-rich layer provides for strong bonding and a thinner, metal-rich layer reduces cost.

SUMMARY OF THE INVENTION

It has been found that a glazing paste comprising glass frit, a metal oxide powder selected from the group consisting of aluminum oxide, magnesium oxide, calcium oxide and zinc oxide, and an organic vehicle can be applied to a ceramic substrate in a first layer to which a second, comparatively thin metal layer can be applied without forming an overglaze on the metal layer.

DETAILED DESCRIPTION OF THE INVENTION

A first layer of glazing paste is screen printed onto a ceramic substrate. According to the present invention this glazing paste is comprised of a glass frit, a metal oxide powder of aluminum oxide, magnesium oxide, calcium oxide and/or zinc oxide, and an organic vehicle. Suitably the glass frit is a lead-boro-aluminosilicate.

The glass frit and the metal oxide powder are mixed together in the organic vehicle in order to form a paste. A wetting agent may be employed to aid in dispersing the glass frit and the metal oxide powder. Suitable organic vehicles are the cellulosic materials such as hydroxypropylcellulose or ethyl cellulose in a solvent such as terpineol or butyl-Carbitol acetate. For each 100 parts by weight of glass frit in the paste there is suitably about 5 to 20 parts by weights of metal oxide powder and from about 28 to 60 parts by weight of the organic vehicle. The glazing paste layer is applied so that it is approximately 2 to 12 micrometers thick. The thicker the glazing paste layer, the stronger the bond between the subsequently applied metal layer to the ceramic substrate. The glazing paste is then fired to a temperature of about 950° C. for about 1 to 10 minutes to remove the organic vehicle and fuse the glass frit and powder to the ceramic substrate. The thickness of the fired first layers are about 1 to 4 micrometers.

Next, a second layer of a metal powder dispersed in an organic vehicle, which can be similar to the above described organic vehicles, is coated onto the fused first layer. Suitably, the metal powder is a mixture of gold, platinum and, optionally, palladium. The coated substrate is then fired to about 900° C. for about 1 to 5 minutes to remove the organic vehicle in the metal paste, to alloy the metals and to fuse the metal layer to the first layer. The longer the device is fired, the stronger will be the bonding to the first layer, but too long a firing may result in overglazing. The second metal layer may be formed as thin as about 15 to 22 micrometers without overglazing.

The formed second metal layer will be wet by molten solder and the layer is well bonded to the substrate. Solder wettability can be determined by measuring the contact angle of a reflowed solder ball on the formed metal layer. The contact angle is the angle formed by a line through the surface of the metal layer and a line tangent to the solder ball at the point of contact with the metal layer wherein the solder ball is inside the contact angle. Contact angles of less than 90° suitably wet the metal layers. The bonding of the metal layer to the substrate can be measured by adhesion strength. Adhesion strength is determined by reflow soldering a wire to the metal layer and pulling on the wire to separate the metal layer from the substrate. Metal layers having adhesion strengths of 0.7 kg/mm$^2$ or greater are suitably bonded to the substrate.

It is believed that when the glazing paste of the present invention is employed to bond a metal layer to a substrate, the glass frit of the glazing paste melts during firing and penetrates into the metal layer. This penetration increases the bonding of the metal layer to the substrate. As the firing continues, however, the metal oxide powders in the glass paste dissolve into the molten glass frit and increases its viscosity. The increased viscosity prevents the glass frit from penetrating further into the metal layer and, hence, prevents overglazing.

The following Examples are presented to further describe the invention, but it is not meant to limit the invention to the details described therein.

EXAMPLE 1

A glazing paste was prepared using aluminum oxide (Al$_2$O$_3$) powder having a median particle size of about 0.05 micrometer and a lead boro-aluminosilicate glass frit having a median particle size of about 2.8 micrometers and the following composition:

| OXIDE | WEIGHT PERCENT |
| --- | --- |
| PbO | 51.26 |
| SiO$_2$ | 29.26 |

| OXIDE | WEIGHT PERCENT |
|---|---|
| $B_2O_3$ | 6.70 |
| $Al_2O_3$ | 3.48 |
| $Na_2O$ | 3.38 |
| CdO | 3.16 |
| $TiO_2$ | 2.67 |
| $Li_2O$ | 0.05 |
| $K_2O$ | 0.04 |

About 5 parts by weight of $Al_2O_3$ and about 100 parts by weight of glass frit were suspended in about 59 parts by weight of an organic vehicle of Partilok C, a trademarked product of a cellulosic material in an organic solvent, available from Thick Film Systems Inc. of Santa Barbara, California.

EXAMPLE 2

A hybrid microcircuit device was prepared utilizing a glazing paste described in Example 1. The glazing paste, in layers about 10 micrometers thick, was screen printed onto an alumina ceramic (96 wt. percent purity) substrate. The ceramic substrate and paste were heated to a temperature of 950° C. for a period of 5 to 10 minutes and then cooled. A first layer about 4 micrometers thick was formed. A metal powder mixture of 75 weight percent of gold, 12.5 weight percent of platinum and 12.5 weight percent of palladium was admixed with a organic vehicle similar to that employed in the glazing paste to form a metal paste. The paste was applied to the fired glass frit layer and heated to a temperature of 900° C. A metal layer of an alloy was formed which was about 17 micrometers thick.

Solder tests and adhesion tests on the metal surface were performed without abrasion or burnishing of the metal surface. It was found that solder balls formed contact angles of about 75 degrees and the adhesion strength was 1.4 kg/mm².

EXAMPLE 3

The procedure of Example 2 was substantially followed except that a metal layer, 21 micrometers thick, was formed by alloying a mixture 75 weight percent of gold and 25 weight percent of platinum. The contact angle of solder balls to the metal surface was found to be about 32 degrees.

I claim:

1. A glazing paste comprising:
   (a) about 80 to about 95 percent by weight of a glass frit;
   (b) about 5 to about 20 percent by weight of a metal oxide powder selected from the group consisting of aluminum oxide, magnesium oxide, calcium oxide and zinc oxide; and
   (c) an organic vehicle wherein the glass frit and the metal oxide powder is suspended in the vehicle to form a paste.

2. A glazing paste according to claim 1 wherein the glass frit is a lead-boro-aluminosilicate.

3. A glazing paste according to claim 1 wherein the metal oxide powder is aluminum oxide.

4. A glazing paste according to claim 1 wherein the proportion of the metal oxide powder is about 5 percent by weight and the glass frit is about 95 percent by weight.

5. A glazing paste according to claim 1 wherein the relative proportion of organic vehicle is about 28 to about 60 parts by weight for each 100 parts by weight of glass frit.

6. A glazing paste according to claim 1 wherein the organic vehicle is cellulosic material in an organic solvent.

7. A glazing paste according to claim 1 wherein the metal oxide powder has a median particle size of about 0.05 micrometers.

8. A hybrid microcircuit device comprising a ceramic substrate, a first glass-rich layer on the substrate and a second metal layer bonded to the substrate by the first layer wherein the first layer is prepared by sintering to the substrate a glazing paste comprising:
   (a) about 80 to about 95 percent by weight of a glass frit;
   (b) about 5 to about 20 percent by weight of a metal oxide powder selected from the group consisting of aluminum oxide, magnesium oxide, calcium oxide and zinc oxide; and
   (c) an organic vehicle wherein the glass frit is suspended in the vehicle to form a paste.

9. A device according to claim 8 wherein the first layer is about 1 to about 4 micrometers thick.

10. A device according to claim 8 wherein the second layer is about 15 to 22 micrometers thick.

11. A device according to claim 8 wherein the second layer is selected from the group consisting of gold, platinum, and palladium.

12. A device according to claim 8 wherein the glass frit is a lead-boro-aluminosilicate.

13. A device according to claim 8 wherein the metal oxide powder is aluminum oxide.

14. A device according to claim 8 wherein the proportion of the metal oxide powder is about 5 percent by weight and the glass frit is about 95 percent by weight.

15. A device according to claim 8 wherein the relative proportion of organic vehicle is about 28 to about 60 parts by weight for each 100 parts by weight of glass frit.

16. A device according to claim 8 wherein the organic vehicle is cellulosic material in an organic solvent.

17. A device according to claim 8 wherein the metal oxide powder has a median particle size of about 0.05 micrometers.

* * * * *